United States Patent
Lin et al.

(10) Patent No.: US 8,920,612 B2
(45) Date of Patent: *Dec. 30, 2014

(54) PROCESS FOR FABRICATION OF A SPUTTER DEPOSITED FULLY DENSE ELECTROLYTE LAYER EMBEDDED IN A HIGH PERFORMANCE MEMBRANE ELECTROLYTE ASSEMBLY OF SOLID OXIDE FUEL CELL

(75) Inventors: Tai-Nan Lin, Taoyuan County (TW); Maw-Chwain Lee, Taoyuan County (TW); Wei-Xin Kao, Taoyuan County (TW); Yang-Chuang Chang, Taoyuan County (TW); Chun-Hsiu Wang, Taoyuan County (TW); Li-Fu Lin, Taoyuan County (TW)

(73) Assignee: Institute of Nuclear Energy Research, Jiaan Village, Longtan, Taoyuan (TW)

( * ) Notice: Subject to any disclaimer, the term of this patent is extended or adjusted under 35 U.S.C. 154(b) by 1228 days.

This patent is subject to a terminal disclaimer.

(21) Appl. No.: 11/964,721

(22) Filed: Dec. 27, 2007

(65) Prior Publication Data

US 2009/0166186 A1 Jul. 2, 2009

(51) Int. Cl.
| | | |
|---|---|---|
| C23C 14/00 | (2006.01) | |
| C23C 14/32 | (2006.01) | |
| B05D 1/32 | (2006.01) | |
| C08J 7/04 | (2006.01) | |
| H01M 8/10 | (2006.01) | |
| H01M 4/48 | (2010.01) | |
| C23C 14/08 | (2006.01) | |
| C23C 14/35 | (2006.01) | |
| H01M 4/86 | (2006.01) | |
| H01M 4/88 | (2006.01) | |
| H01M 8/12 | (2006.01) | |

(52) U.S. Cl.
CPC ............ *C23C 14/083* (2013.01); *C23C 14/352* (2013.01); *H01M 4/8621* (2013.01); *H01M 4/8885* (2013.01); *H01M 8/1213* (2013.01); *H01M 8/1246* (2013.01); *Y02E 60/521* (2013.01); *Y02E 60/525* (2013.01)
USPC ............ 204/192.15; 204/192.12; 204/192.17; 427/466; 427/504; 429/482; 429/488; 429/489

(58) Field of Classification Search
USPC ........... 204/192.15, 192.12, 192.17; 429/482, 429/488, 489; 427/466, 504
See application file for complete search history.

(56) References Cited

U.S. PATENT DOCUMENTS

| 6,007,683 | A  | * | 12/1999 | Jankowski et al. | ...... | 204/192.17 |
| 6,926,852 | B2 | * | 8/2005  | Satou et al.     | ...... | 264/42     |
| 2005/0221163 | A1 | * | 10/2005 | Yang et al.   | ...... | 429/44     |
| 2009/0151850 | A1 | * | 6/2009  | Kao et al.    | ...... | 156/64     |

* cited by examiner

*Primary Examiner* — Michael Band

(57) ABSTRACT

The innovation process describes the process and results for fabrication of a magnetron sputter deposited fully dense electrolyte layer (8YSZ/GDC/LSGM) embedded in a high performance membrane electrolyte assembly (MEA) (Unit Cell) of Solid Oxide Fuel Cell. A single cell with airtight electrolyte layer (8YSZ/GDC/LSGM) is prepared via thin film technique of magnetron sputter deposition, combined with SOFC-MEA processing methods (such as tape casting, lamination, vacuum hot pressing, screen printing, spin coating, and plasma spray coating) and sintering optimization conditions. The gas permeability of the electrolyte layer is below $1 \times 10^{-6}$ $L/cm^2/sec$ and the open circuit voltage/power density of the single cell performance test exceeds 1.0 V and 500 $mW/cm^2$.

5 Claims, 4 Drawing Sheets

(a)

(b)

PROCESS FOR FABRICATION OF A SPUTTER DEPOSITED FULLY DENSE ELECTROLYTE LAYER EMBEDDED IN A HIGH PERFORMANCE MEMBRANE ELECTROLYTE ASSEMBLY OF SOLID OXIDE FUEL CELL

BACKGROUND OF THE INVENTION

1. Field of the Invention

The invention relates to a manufacturing process for the electrolyte layer of solid oxide fuel cell. Especially it relates to a manufacturing process for a membrane, i.e. magnetron sputtering. It is also combined with the manufacturing process for membrane electrode assembly (MEA), like tape casting, lamination, vacuum hot pressing, screen printing, spin coating or plasma spray coating et al. and optimized sintering technology in a novel process for fully dense electrolyte to produce air-tight electrolyte layer for solid oxide fuel cell.

2. Description of the Prior Art

With rising oil price and consciousness of environmental protection, renewable energy technology has become one of the most important technological development in this century. Solid oxide fuel cell is a power generation system that has high efficiency, low pollution and diversified energy sources. Its simple material composition, modulized structure and sustainable and stable power generation ability make it the power generation system of the most potential.

Electrolyte supported cell (ESC) has its operation temperature between 800~1000° C. Its electrolyte substrate thickness is around 150~300 μm. This is the first generation of SOFC-MEA. Anode supported cell (ASC) has its operation temperature between 650~800° C. Its electrolyte substrate thickness is around 10 μm. This is the second generation of SOFC-MEA. (NiO+8YSZ) (NiO, Nickel Oxide YSZ, Yttria-Stabilized Zirconta) is the anode material for ASC/ESC, while the main cathode material is LSM (Strontium doped lanthanum-magnetite) and LSCF (LSCF, Lanthanum Strontium Cobalt Ferrite) with thickness between 30~60 μm. New electrolyte materials and cathode materials are under development in many research laboratories in the world. They all hope to develop new materials so the operation temperature for SOFC-MEA will drop to 500~700° C. Then the components for SOFC Stack, like Inter-connector etc., can change from ceramic materials to metal materials, which are not only easy for manufacturing but also increase mechanical stability and durability, and also reduce overall cost. The development for this technology in universities and national laboratories emphasize material development and expect to develop novel materials to reduce resistance, increase ion conductivity and improve SOFC power generation.

SUMMARY OF THE INVENTION

The main objective for the invention is to develop the manufacturing process for solid oxide fuel cell that has fully dense electrolyte layer.

To achieve the above objective, it is proposed that the process is mainly a magnetron sputtering process, which is also combined with the manufacturing process for membrane electrode assembly (MEA), like tape casting, lamination, vacuum hot pressing, screen printing, spin coating or plasma spray coating et al. and optimized sintering technology in a novel process for fully dense electrolyte to produce air-tight electrolyte layer for solid oxide fuel cell. The magnetron sputtering process referred in the invention comprises (1) RF magnetron sputtering with oxide target (2) reactive magnetron sputtering with sputtering metal alloy target, including DC and RF. Take anode supported cell (ASC) as example. The process in this invention uses magnetron sputtering technology to produce electrolyte membrane on anode substrate, and then uses high-temperature sintering to produce half-cell structure, and then uses screen printing technology to coat cathode layer onto the electrolyte surface of the half-cell. Therefore, this invention can produce solid oxide fuel cell of anode supported cell with fully dense electrolyte layer.

The above and other objects, features and advantages of the present invention will become apparent from the following detailed description taken with the accompanying drawings.

DETAILED DESCRIPTION OF THE PREFERRED EMBODIMENT

This invention refers to a process to manufacture planar solid oxide fuel cell-membrane electrolyte assembly (i.e. Unit Cell) with fully dense/zero gas leakage rate or airtight electrolyte layer, for example, 8YSZ (Yttria-Stabilized Zirconia)/GDC (Gadolinia-doped Ceria)/YDC (Yttria-doped Ceria)/LSGM (Lanthanum Strontium Gallium Magnetite) et al. The procedures for the manufacturing process are as follows:

Step 1: Onto the electrode substrate of planar SOFC-MEA, use magnetron sputtering to build electrolyte membrane (5~15 μm) to form half cell of SOFC. Conduct sintering for several hours (more than 3 hours) between 1200° C.~1600° C. (preferably 1400° C.) to produce the first stage half cell. For this stage, the electrolyte can be YSZ, GDC, YDC, SDC and LSGM. Use scanning electronic microscope (SEM) to analyze the microstructure for the half cell to assure that the half cell is open-pore free and fully dense.

Figure 1:
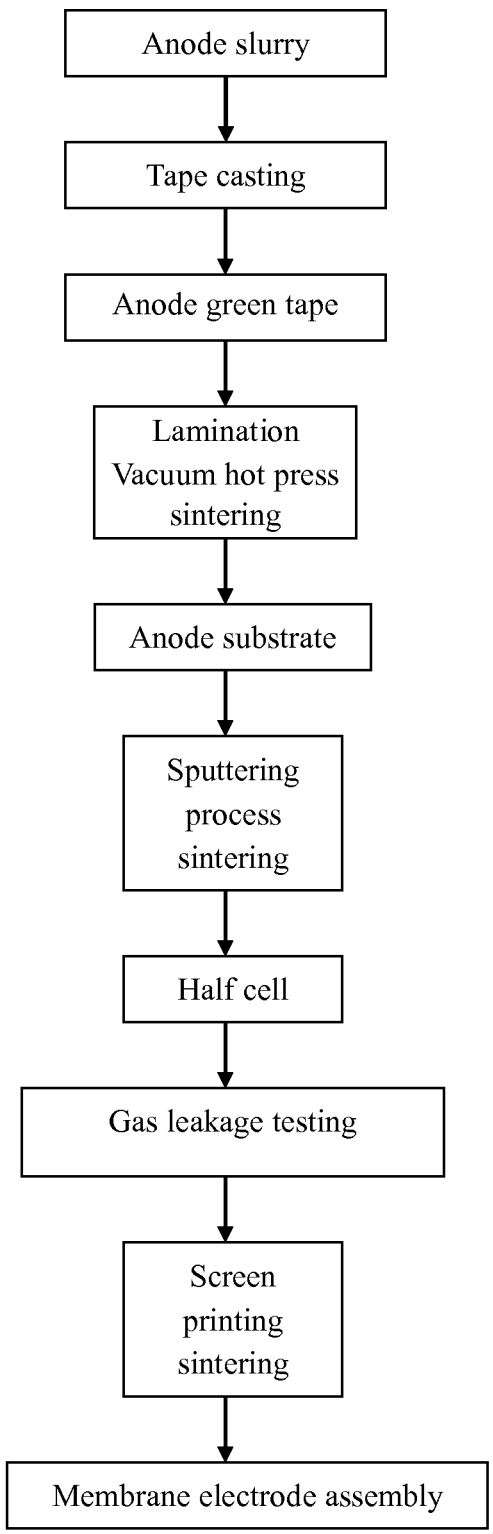
FIG. 1 is a process diagram of the present invention.

Step 2: Onto the electrolyte layer of the half cell, use screen printing technology to build porous cathode layer, usually the material is LSM (Strontium doped lanthanum-magnetite) or LSCF (Lanthanum Strontium Cobalt Ferrite) etc. Then conduct sintering for about 3 hours at about 1200° C. to complete the fabrication of SOFC-MEA. The SOFC-MEA produced from the process has high operational performance, durability and stability. The excellent properties can be verified by performance test of SOFC-MEA. The above process is the fabrication process for SOFC-MEA with fully dense/airtight electrolyte layer. A simple flow diagram for the above step 1 and step 2 is shown in FIG. 1. The following describes the details of the embodiments:

Embodiment 1

Step 1: A process to produce SOFC-MEA Unit Cell with fully dense/airtight electrolyte layer (8YSZ/GDC/LSGM). The anode substrate for this MEA is made of 50 wt % NiO+50 wt % 8YSZ and pore former in a certain amount and graphite through tape casting, lamination and vacuum hot pressing. It has high mechanical strength. The thickness is about 1000 μm. Its size is 5×5 cm²~12×12 cm².

Figure 2:
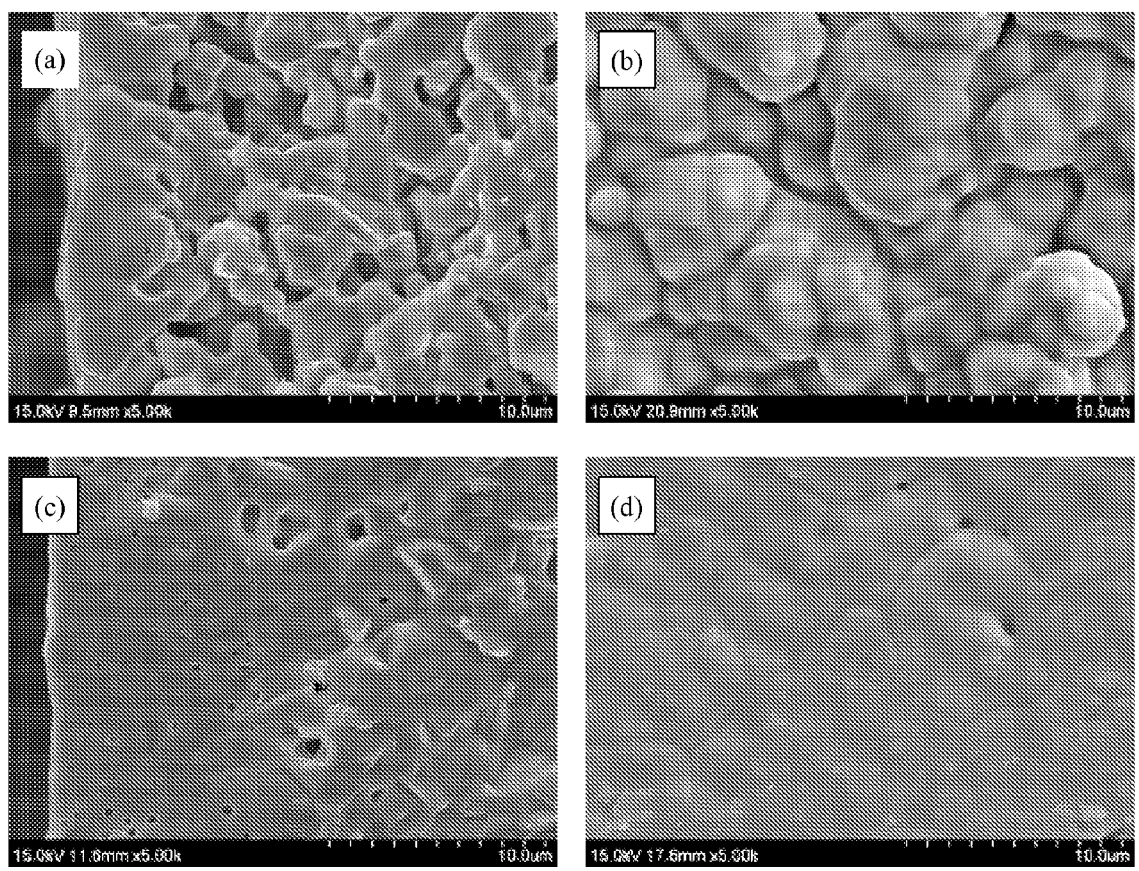
FIG. 2 is SEM picture of the cross-sectional microstructure for the solid oxide fuel cell through membrane technology and sintering in the invention: (a) structure of the half cell with electrolyte made of oxide target; (b) surface morphology of the electrolyte made of oxide target; (c) structure of the half cell with electrolyte made of alloy target; (d) surface morphology of electrolyte made of alloy target.

Step 2: A process to produce electrolyte membrane. Use RF magnetron sputtering (target is 8YSZ oxide) and DC magnetron sputtering (target is $Zr_xY_{1-x}$ alloy) to deposit electrolyte materials onto electrode substrate in thickness of 5~10 μm to form SOFC half cell. Conduct sintering for several hours (more than 3 hours) between 1200° C.~1600° C. to obtain the first stage half cell. Use SEM to analyze the microstructure for the half cell to assure that the electrolyte layer is open-pore free. As shown in FIG. 2, the electrolyte thickness is about 5/10 μm. There is a fully dense structure to achieve airtightness and meet the requirements for SOFC-MEA electrolyte layer. There remain only few close pores, which do not affect the airtightness and gas permeability of the electrolyte layer.

Step 3: To assure the airtightness, measure the gas permeability of the half cell obtained in step 2. If the gas permeability is below $1\times10^{-6}$ l/cm²/sec, it is assured that the electrolyte layer is fully dense.

Figure 3:
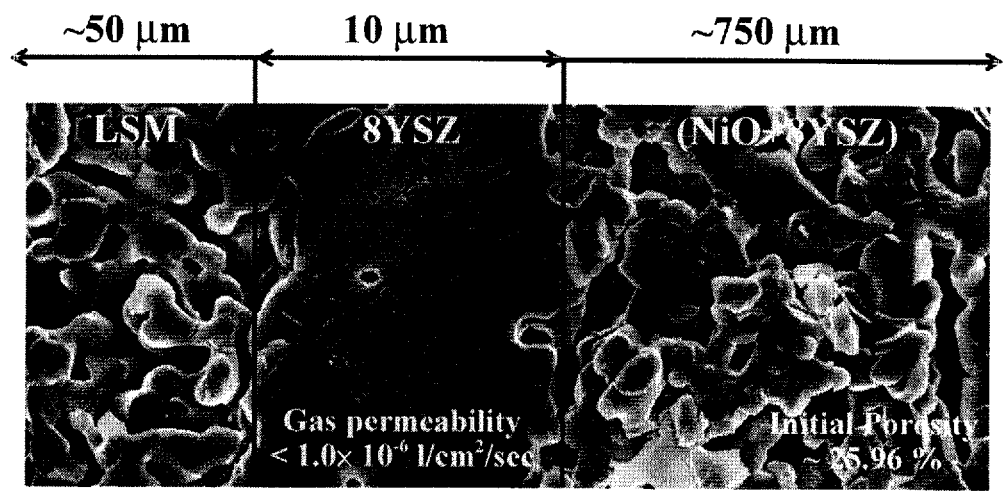
FIG. 3 is the microstructure diagram of the full cell with electrolyte made of oxide target.
Figure 4:
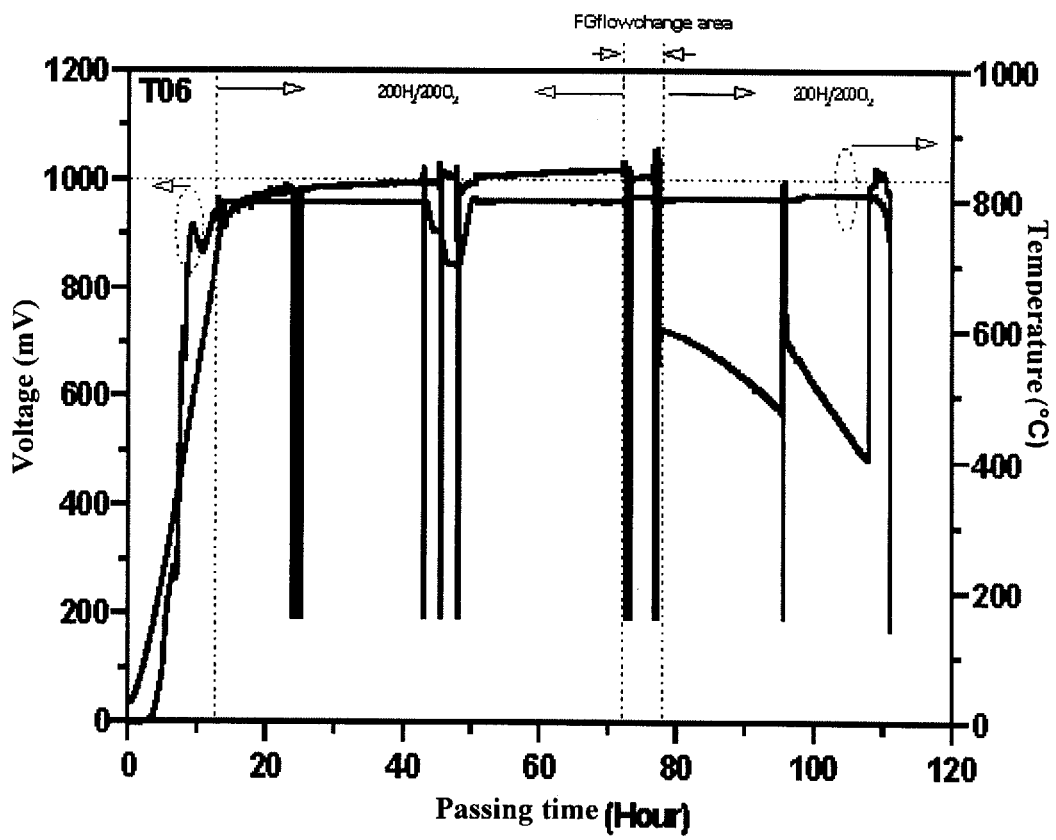
FIG. 4 is the electrical performance testing process for the solid oxide fuel cell with electrolyte layer made of oxide target material.
Figure 5:
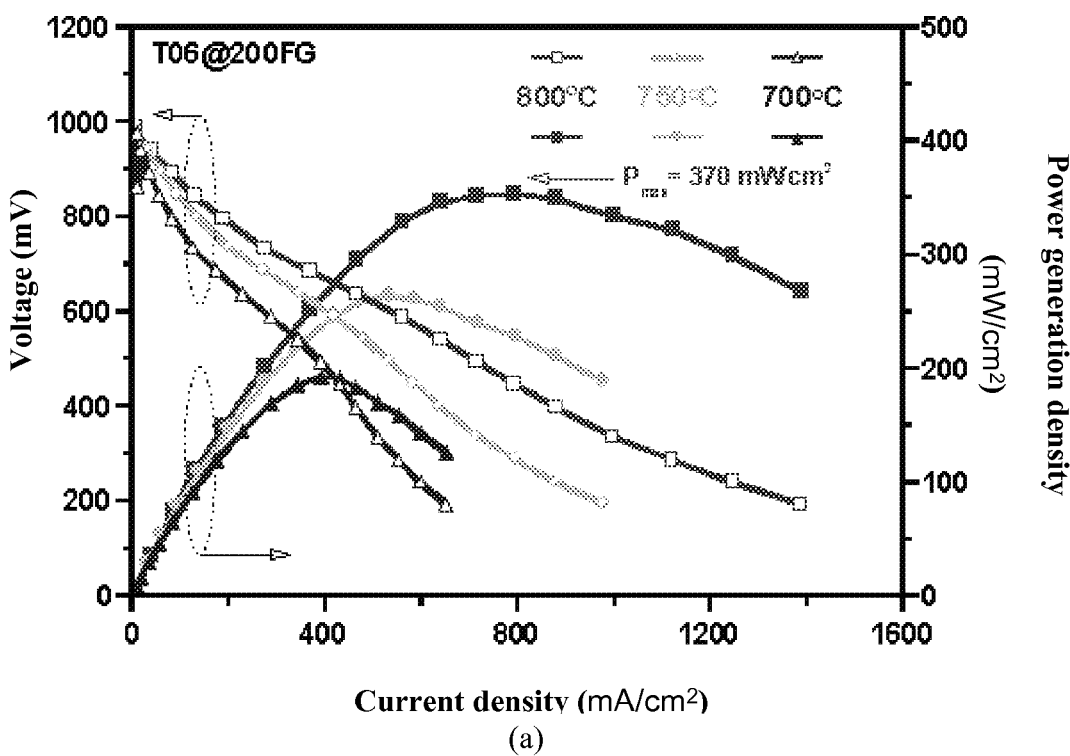
FIG. 5 is the JVP (current density/voltage/power density) diagram obtained from results of the electrical performance test of the solid oxide fuel cell (a) testing result of unit cell at different temperatures (700/750/800° C.); (b) testing result of unit cell at different $H_2/O_2$ flow rates (100% $H_2/O_2$ with flow rates: 200/300/400 cc/min).
Figure 5:
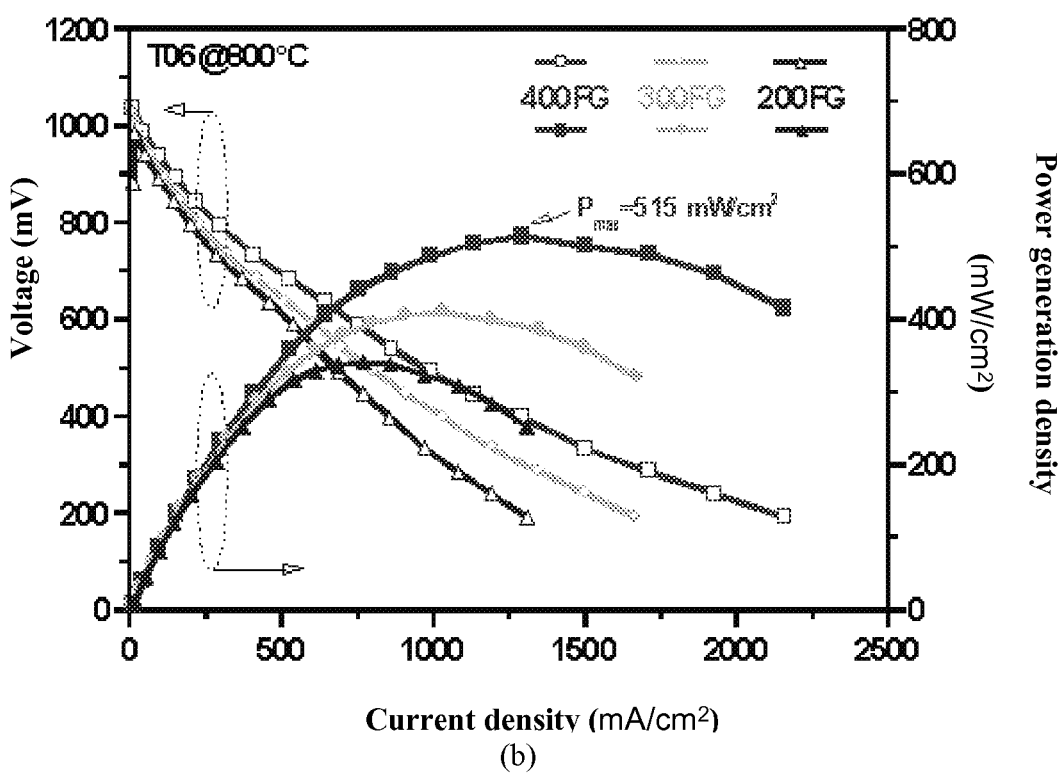

Step 4: Onto the fully dense half cell from step 3, use screen printing technology to build the porous cathode layer of LSM. Then conduct sintering at 1100° C. for 3 hours to produce high performance SOFC-MEA (Unit cell). The cross-sectional microstructure of the unit cell observed by SEM is shown in FIG. 3. The SOFC-MEA is subject to electrical testing. Power performance testing temperature is 700/750/800° C. the testing atmosphere is 100% $H_2/O_2$. The flow rate is 200/300/400 cc/min. the testing time is more than 120 hours. There is no sign of performance degradation after testing. The result of testing process is shown in FIG. 4. The open circuit voltage (OCV) is stable and close to theoretical value. The maximum values of OCV and power density are up to 1.06V and 515 mW/cm² at 800° C., respectively (as shown in FIG. 5). This indicates that the electrolyte layer produced by sputtering process is dense and stable. The unit cell has high performance. The results prove the excellence, innovation and technological criticalness for the manufacturing process of this invention. The invention should meet requirements for patent application, which is thereafter submitted.

The above process is merely an example for the invention, not to limit the scope for the invention. Those simple and equivalent alteration or modification based on the description of the invention shall be covered by the scope of the invention.

What is claimed is:

1. A manufacturing process for planar SOFC-MEA with dense electrolyte layer comprising the following steps:
   a. producing an anode electrode substrate with size in a range from 5×5 cm² to 12×12 cm² with thickness about 1000 μm;
   b. producing a half cell onto the electrode substrate by magnetron sputtering, wherein the magnetron sputtering process comprising either (1) RF magnetron sputtering with oxide target materials, which is one of YSZ+NiO, GDC+NiO, LSGM+NiO, SDC+NiO, YDC+NiO, or YSZ, or GDC, or LSGM, or SDC, or YDC, wherein the RF magnetron sputtering is by dual gun co-sputter to deposit the electrolyte material onto the electrode substrate, or (2) reactive magnetron sputtering with metal alloy target materials, which is one of $Zr_x$—$Y_{1-x}$, $Zr_x$—$Sc_{1-x}$, $Ce_x$—$Gd_{1-x}$, $Ce_x$—$Sm_{1-x}$, $Ce_x$—$Y_{1-x}$, where x is represented by a range of 80%<x<100%, or LSGM, wherein the reactive magnetron sputtering is by dual gun co-sputter to deposit electrolyte materials onto the electrode substrate in thickness of 5~10 μm to form the half cell;
   c. producing the half cell with high-temperature sintering for anode/electrolyte half cell; sintering temperature is about 1400° C.; sintering time is about 6 hours; conducting gas permeability testing by using SEM to examine the microstructure of the half cell to assure the full densification of electrolyte layer having gas permeability less than $1\times10^{-6}$ L/cm²/sec, if yes, then proceed to step d; if open pores still exist, further adjusting sintering temperature in a range from 1200° C. to 1600° C. and sintering time more than 3 hours to achieve dense structure;
   d. building a porous layer of cathode material by screen printing onto the half cell with dense electrolyte layer; conducting sintering at about 1100° C. for about 3 hours to obtain a full unit cell with dense electrolyte layer; conducting electrical performance testing and power density measurement to ensure the full unit cell performance in achieving a power density about 515 mW/cm² with open circuit voltage about 1.06V at about 800° C.

2. The manufacturing process for planar SOFC-MEA with dense electrolyte layer as described in claim 1, the electrolyte materials is one of YSZ, GDC, LSGM, SDC or YDC.

3. The manufacturing process for planar SOFC-MEA with dense electrolyte layer as described in claim 1, the electrode substrate in step a is anode substrate or electrolyte substrate, and material used for the electrode substrate is one of YSZ+NiO, GDC+NiO, LSGM+NiO, SDC+NiO, YDC+NiO, or YSZ or GDC or LSGM or SDC or YDC, respectively, a weight percent for electrolyte and anode catalyst material NiO is 30~65 wt %.

4. The manufacturing process for planar SOFC-MEA with dense electrolyte layer as described in claim 1, the sintering process in step c is at about 1400° C. for 6 hours, and sintering equipment is air-circulating high-temperature furnace; sintering temperature rate is about 3° C./min.

5. The manufacturing process for planar SOFC-MEA with dense electrolyte layer as described in claim 1, step d includes building a layer of cathode material onto the half cell with high dense electrolyte layer by screen printing; the sintering process is about 1100° C./3 hrs; cathode materials include LSM and LSCF; cathode thickness is 30~50 μm, and sintering temperature rate is about 3° C./min.

* * * * *